United States Patent [19]
Lang et al.

[11] Patent Number: 6,049,554
[45] Date of Patent: *Apr. 11, 2000

[54] EXTERNAL CAVITY, CONTINUOUSLY TUNABLE WAVELENGTH SOURCE

[75] Inventors: Robert J. Lang, Pleasanton; David G. Mehuys, Sunnyvale; David F. Welch, Menlo Park, all of Calif.

[73] Assignee: SDL, Inc., San Jose, Calif.

[ * ] Notice: This patent is subject to a terminal disclaimer.

[21] Appl. No.: 08/984,485

[22] Filed: Dec. 1, 1997

Related U.S. Application Data

[63] Continuation of application No. 08/592,906, Jan. 29, 1996, Pat. No. 5,771,252.

[51] Int. Cl.[7] .................................................. H01S 3/086
[52] U.S. Cl. ............................................ 372/20; 372/102
[58] Field of Search ................................ 372/20, 18, 102

[56] References Cited

U.S. PATENT DOCUMENTS

| | | | |
|---|---|---|---|
| 4,839,884 | 6/1989 | Schloss | 370/3 |
| 5,255,273 | 10/1993 | Nilsson et al. | 372/20 |
| 5,319,652 | 6/1994 | Moeller et al. | 372/6 |
| 5,319,668 | 6/1994 | Luecke | 372/107 |
| 5,374,991 | 12/1994 | Atkinson et al. | 356/358 |
| 5,561,676 | 10/1996 | Goldberg | 372/18 |
| 5,771,252 | 6/1998 | Lang et al. | 372/20 |

OTHER PUBLICATIONS

Mar et al. "Mode–Locked Operation of a Master Oscillator Power Amplifier", IEEE Photonics Technology Letters, vol. 6, No. 9, pp. 1067–1069, Sep. 9, 1994.

H. Tsuchida, "Tunable, Narrow Linewidth Output from an Injection Locked High Power AlGaAs Laser Diode Array", Optics Letters, vol. 19(21), pp. 1741–1743, Nov. 1, 1994.

Goldberg et al. "High Power Mode–locked Compound Laser Using a Tapered Semiconductor Amplifier" IEEE Photonics Technology Letters, vol. 6, No. 9, pp. 1070–1072, Sep., 1994.

*Primary Examiner*—James W. Davie
*Attorney, Agent, or Firm*—W. Douglas Carothers, Jr.

[57] ABSTRACT

An external cavity, continuously tunable wavelength source comprising a coherent light source having an external cavity including a reflector, such as a mirror or right-angle prism, for reflecting a selected wavelength from a diffraction grating back into the coherent light source. The wavelength is selected by simultaneous rotation and linear translation of the reflector about a pivot point such that the optical path length of the external cavity is substantially identical to a numerical integer of half wavelengths at a plurality of tunable wavelengths about a central wavelength of a tunable bandwidth for the source such that cavity phase error is zero at the central wavelength and is maximally flat on either side of the center wavelength within the tunable bandwidth. The location of said pivot axis is chosen to set the cavity phase error equal to zero and its first and second derivatives substantially equal to zero at exactly one wavelength. The external cavity may be either a Littman optical cavity configuration or a Littrow external cavity configuration. The output of the coherent light source is optically coupled to a gain element for amplification.

12 Claims, 10 Drawing Sheets

EXTERNAL CAVITY, CONTINUOUSLY TUNABLE WAVELENGTH SOURCE

REFERENCE TO RELATED APPLICATION

This is a continuation of patent application Ser. No. 08/592,906, filed Jan. 29, 1996 now U.S. Pat. No. 5,771,252, entitled, EXTERNAL CAVITY, CONTINUOUSLY TUNABLE WAVELENGTH SOURCE, which is incorporated herein by its reference.

STATEMENT AS TO RIGHTS TO INVENTIONS MADE UNDER FEDERALLY SPONSORED RESEARCH AND DEVELOPMENT

This invention was made with government support under Contract No. NAS2-14086, awarded by the National Aeronautics and Space Administration and under Contract No. 50-DKNA-4-00121 awarded by the Department of Commerce. The government has certain rights in the invention.

BACKGROUND OF THE INVENTION

The present invention relates generally to coherent light sources that are wavelength tunable within a tuning bandwidth of the source and, more particularly, to such a tunable source with an optical gain element, such as a laser diode, and having an external cavity with an external light beam reflector which is simultaneously rotatable and translatable to provide for continuous linear wavelength tuning without external cavity mode hopping.

Figure 1A:
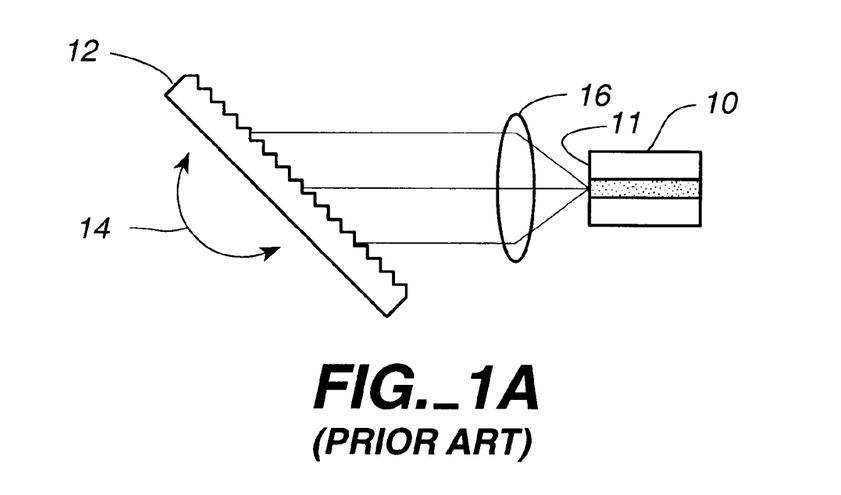
FIG. 1A is a schematic illustration of a conventional Littrow configuration.
Figure 1B:
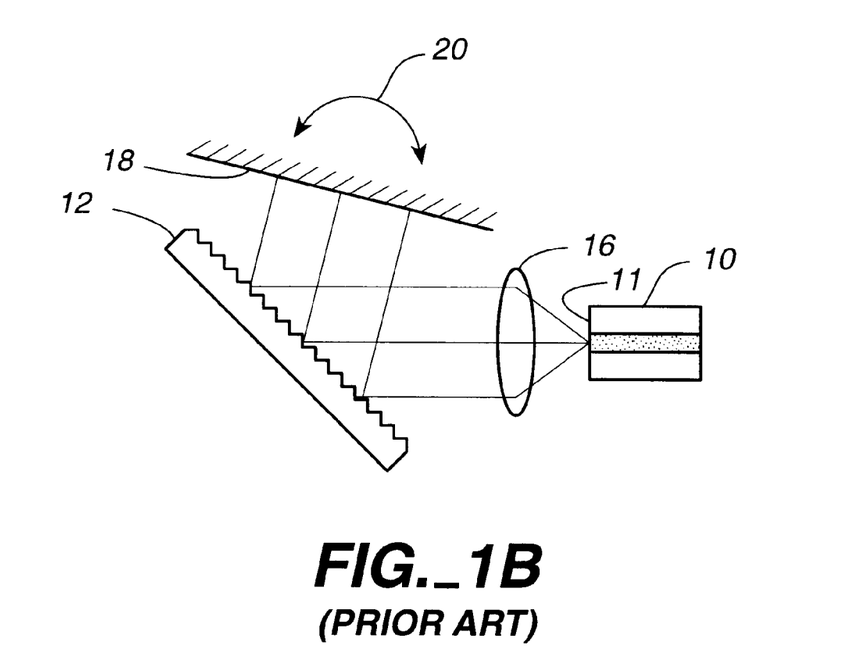
FIG. 1B is a schematic illustration of a conventional Littman configuration.

Semiconductor laser diodes typically operate in multiple longitudinal modes, i.e., at multiple frequencies. It is desirable, however, for these lasers for certain applications to operate in a single longitudinal mode over a tunable frequency range to provide single-frequency operation. Examples of such applications are disclosed in U.S. Pat. No. 5,392,308 to Welch et al., which is incorporated herein by reference thereto. Several configurations have been disclosed for arranging a diffractive grating along with or combined with other reflective elements and other optical elements together with a laser diode establishing an external optical path to insure single longitudinal mode tuning. Examples are shown in FIGS. 1A–1B. FIG. 1A illustrates a Littrow type configuration. In this configuration, laser diode 10 is combined with a rotatable reflective element grating 12, as indicated by arrow 14, via appropriate optics 16 to provide frequency selection feedback for laser diode 10. FIG. 1B illustrates a Littman type configuration. In this configuration, laser diode 10 is combined to form an external optical cavity with a fixed reflective element grating 12 and rotatable reflective element 18, as indicated by arrow 20, to provide frequency selection feedback for laser diode 10.

Many different kinds, variations and improvements have been suggested and disclosed based upon these two configurations, in particular, simplifying optical element alignment, manufacture and packaging of these external cavity tuned semiconductor laser diodes. An example is the Littman configuration shown in FIG. 2A involving a rotatable reflective element 18A comprising a prism, e.g., a right angle prism, of the type disclosed in U.S. patent application Ser. No. 08/497,435, filed Jun. 30, 1995 and entitled "Light Emitting Optical Device With External Retro-Reflector", assigned to the same assignee herein and incorporated by reference. The use of such a prism simplifies the external cavity alignment of the optical elements.

Figure 2A:
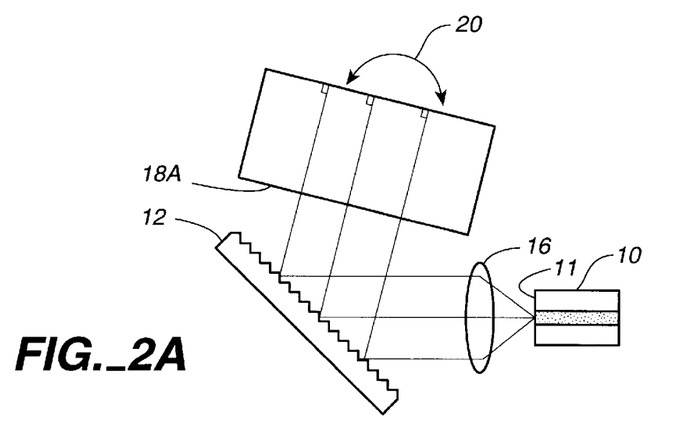
FIG. 2A is a schematic illustration of a modified Littman configuration with rotatable reflective element comprising a prism.
Figure 2B:
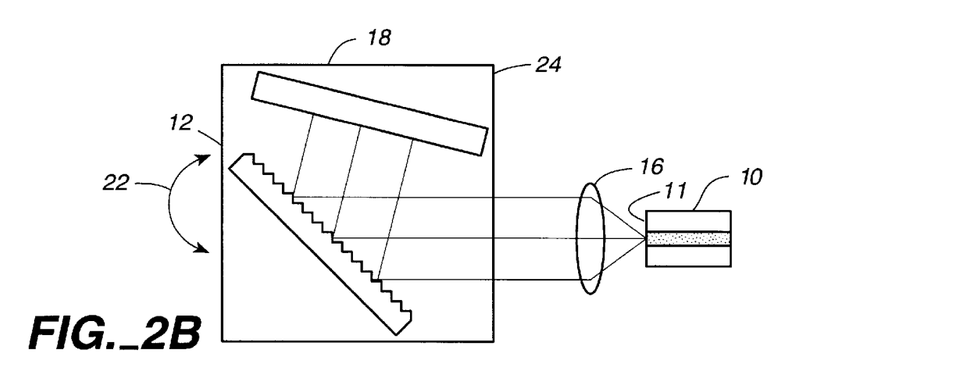
FIG. 2B is a schematic illustration of a modified Littman configuration with a fixed prism/grating platform rotatable as a unit.

FIG. 2B is another illustration of the Littman configuration with simplified external cavity alignment wherein both reflective element grating 12 and reflective element 18 are rotatable as a unit, as indicated by arrow 22, as supported on a frame or platform 24.

Figure 2C:
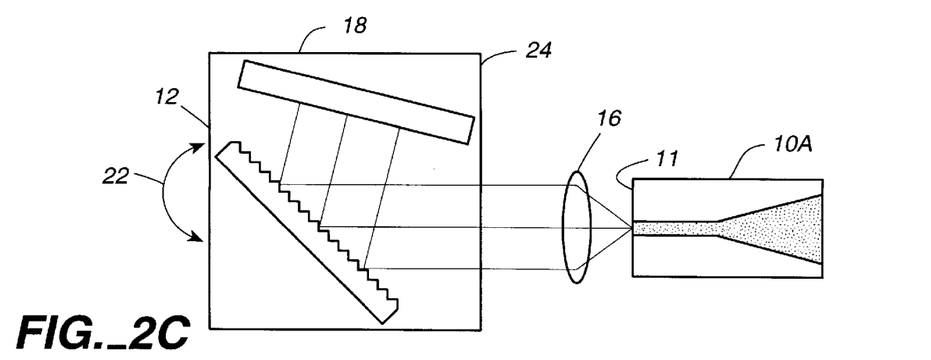
FIG. 2C is a schematic illustration of the platform configuration of FIG. 2B with a flared semiconductor amplifier as the light source.

Lastly, FIG. 2C illustrates a Littman platform configuration wherein the light source may be a flared semiconductor amplifier or may be a master oscillator power amplifier (MOPA) 10A. It will be apparent to those skilled in the art that there are many other possible combinations based upon either of the Littrow and Littman configurations.

For all of these different configurations, rotation of the movable element or elements, such as the reflective element or the reflective grating or a combination of both (hereinafter collectively referred to as "movable element"), will change the wavelength of the light propagating within the optical cavity. However, as changes are made in the laser wavelength, frequency changes will result in a discontinuous fashion as the oscillation frequency hops between distinct, spatial longitudinal modes of the optical cavity, unless special precautions are taken in the design of the movable element(s). It is a desirable feature, therefore, in such tunable external cavities that the longitudinal mode spectrum continually changes with frequency with the continuous rotation of the movable element(s) at the same rate of change in the preferred feedback wavelength resulting in truly continuous tuning of the output frequency of the external cavity. This condition is satisfied when the single-pass optical path length of the external cavity remains equal or nearly equal to the same integral number of half-wavelengths available across the tuning range of the laser cavity. It is a further desirable feature that the continuous tuning range of the laser cavity be as large as possible and that frequency-pulling effects resulting from slight deviations of the optical path length from the ideal are minimized.

The above mentioned features and conditions may be satisfied when the mechanical linkage that provides rotation of the movable element(s) also provides for a simultaneous translation of the element in such a way that the optical path length remains nearly constant as a function of wavelength change. Such simultaneous translation and rotation may be achieved by offsetting the center of rotation, i.e., the pivot point, of the movable element from the center of mass of the movable element. By proper choice of the location of the pivot point, the range of continuous tunability over the wavelength band of the laser diode may conceivably be maximized.

It is well known that, in order to avoid mode hopping between optical cavity longitudinal modes in an external cavity laser diode having an external grating mirror, the grating angle and the length of the external cavity must varied simultaneously so that the cavity longitudinal mode wavelength matches the grating wavelength. This is explained in U.S. Pat. No. 5,319,668 to Luecke as avoidance of tuning discontinuities by maintaining a constant integral number of half wavelengths in the external optical cavity over the entire wavelength tuning range available from the laser diode. U.S. Pat. No. 5,319,668 discloses a geometric construction for the location of the pivot point for a Littman configuration shown in FIG. 1B that employs a mirror as the movable element. The construction is carried out in such a way that the deviation of the optical path length from an integral number of half wavelengths, termed the "cavity phase error", is set equal to zero at three distinct wavelengths. This approach requires knowledge of the optical indices of refraction of all of the materials in the cavity at the three separate wavelengths. However, the construction disclosed in U.S. Pat. No. 5,319,668 does not describe or deal with external cavities based on a Littrow configuration, such as shown in FIG. 1A. Nor does the disclosure deal with the employment of a prism as a rotatable element or the combination of a grating and prism in fixed relation and rotatable as a unit, such as shown in FIGS. 2A and 2B. Furthermore, the method disclosed in U.S. Pat. No. 5,319,668 provides a residual cavity phase error that deviates from zero at wavelengths at positions between the three established wavelengths. This results in a small amount of frequency-pulling near the center of the wavelength band of the laser diode.

Figure 3:
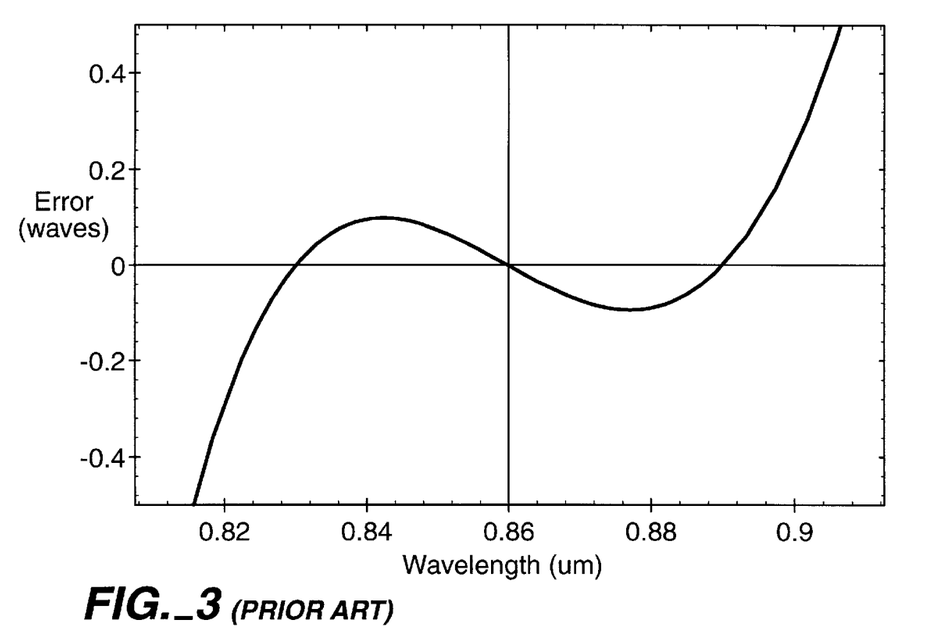
FIG. 3 is a graphical representation of the residual error in mirror position across the selectable wavelength band of a laser diode in accordance with the three position calculation approach disclosed in U.S. Pat. No. 5,319,668.

The geometric terms formulated by Luecke are indicated to take into account the effects of residual cavity phase error, including dispersion, as a function of wavelength caused by optical elements within the light path of the external cavity, in the calculation of mirror positions for three mirror different positions and corresponding wavelengths within the laser diode bandwidth. Such optical elements are the lenses, windows and air itself. Accordingly, the effectiveness of the three position wavelength calculation according to the methods disclosed in U.S. Pat. No. 5,319,668 is illustrated in FIG. 3 for comparison purposes with the instant invention illustrated in FIG. 4, which will be discussed in greater detail later.

It is an object of this invention to provide a external cavity, continuously tunable wavelength source, such as a laser diode device using an external cavity reflective grating, providing continuous wavelength tuning without longitudinal mode hopping.

It is a further object of this invention to provide a means to design a continuously tunable cavity with large tuning range based on the optical properties of the optical system at a single wavelength without any necessity for consideration of distinct plural wavelengths.

It is a further object of this invention to provide a design for the pivot point location of an external cavity laser in which the cavity phase error near the center of the wavelength band of the laser diode is made as small as possible.

It is another object of this invention to provide a design for the pivot point location of an external cavity laser that can be applied to a cavity configuration that include prisms, rotatable gratings, and rotatable grating/prism combinations that provide continuous single-frequency tuning over large wavelength bands.

It is another object of this invention to provide a continuously tunable laser diode device that provides only a single wavelength approach for reflective element error over the wavelength band of the laser diode with lateral deviation in cavity phase error remaining relatively small across the wavelength band of the laser diode.

SUMMARY OF THE INVENTION

According to this invention, an external cavity, continuously tunable wavelength source, such as a single stripe laser diode, tapered optical gain elements, or a master oscillator power amplifier (MOPA), together with an external optical cavity with a reflective grating having a pivot point for the reflective grating near the laser and other optical elements such that the path length of the external optical cavity has the same number of wavelengths at any wavelength within the coherent light source operating bandwidth providing continuous wavelength tuning without longitudinal mode hopping. The external cavity, continuously tunable wavelength source does not require consideration of a multiple wavelength position calculation across the tunable bandwidth, such as the three position calculation approach disclosed in U.S. Pat. No. 5,319,668, to determine the pivot point for the reflective element in the external optical cavity. Rather, the source here relies on the optical properties of the optical system at a single wavelength, and is characterized by a phase error curve comprising a cubic function with a single root having minimal deviation from zero near the root so that longitudinal mode hopping will not occur during tuning.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENT OF THE INVENTION

The following general analytical description of this invention is made with respect to an arbitrary optical cavity in an external cavity, continuously tunable wavelength source. However, it will be apparent from the description below to those skilled in the art that the invention can be applied to all of the optical cavities illustrated in FIGS. 1A–1B and 2A–2C as well as other types of optical cavities not shown.

First, the single-pass optical path length (OPL) of the external cavity is defined as $L(\lambda) = l_1 n_1(\lambda) + l_2 n_2(\lambda) + \ldots$, where $l_i$ is the length of the ith optical element (including air gaps) and $n_i(\lambda)$ is the index of refraction of the ith element at wavelength $\lambda$, as measured along the chief ray of the cavity. Continuous tuning is obtained when the optical path length of the cavity is maintained at a constant number of wavelengths, i.e., when the quantity $L(\lambda)/\lambda$ is held constant at some value $L(\lambda_0)/\lambda_0$ determined at a design wavelength $\lambda_0$. The design goal is to maintain the actual quantity $L(\lambda)/\lambda$ as close to this constant value as possible, which is achieved by performing simultaneous rotation and translation of the movable elements.

The optical path length $L(\lambda)$ can be divided into two parts: a "fixed" OPL part, $L_f(\lambda)$, where the distances, $l_i$, do not change with motion of the movable elements (although the indices of refraction $n_i$ do change due to dispersion), and a "variable" OPL part, $L_v(\lambda)$, in which the distances, $l_i$, do change with such motion so that $$L(\lambda) = L_f(\lambda) + L_v(\lambda). \tag{1}$$

To obtain continuous tuning, the variable OPL $L_v(\lambda)$ must change with rotation and wavelength so as to keep $L(\lambda)/\lambda$ constant. Therefore, we define an ideal wavelength-dependent variable OPL $L_v^{(ideal)}(\lambda)$ by $$L_v^{(ideal)}(\lambda) \equiv \left[\frac{\lambda}{\lambda_0} L(\lambda_0) - L_f(\lambda)\right] = \left[\frac{\lambda}{\lambda_0}(L_f(\lambda_0) + L_v^{(ideal)}(\lambda_0)) - L_f(\lambda)\right]. \tag{2}$$

Simultaneous rotation and translation of the movable elements is achieved by rotation of the movable elements about an offset pivot point Q. Although $L_v^{(ideal)}(\lambda)$ is the desired variable OPL, the actual OPL is determined by the mechanical linkage between the pivot point and the rotating element. Geometric analysis of the configuration of the rotating elements provides a relationship for the distances in the variable OPL as a function of rotation angle, while the diffraction law for the grating provides the relationship between rotation angle and wavelength. Consequently, by eliminating the rotation angle from the two relationships, it is possible to devise an expression for the actual variable OPL $L_v^{(actual)}(\lambda)$ created by the mechanical linkage as a function of wavelength $\lambda$.

Continuous tuning is obtained over wavelengths, $\lambda$, where $L_v^{(ideal)}(\lambda)$ is equal to $L_v^{(actual)}(\lambda)$ to within a fraction of a wavelength. We can, therefore, define a "cavity phase error" as $$g(\lambda) \equiv \frac{L_v^{(ideal)}(\lambda) - L_v^{(actual)}(\lambda)}{\lambda}, \tag{3}$$

which is the deviation of the optical cavity in wavelengths from the ideal condition. Continuous tuning is obtained over ranges where $g(\lambda)$ is substantially smaller than ½.

Figure 5:
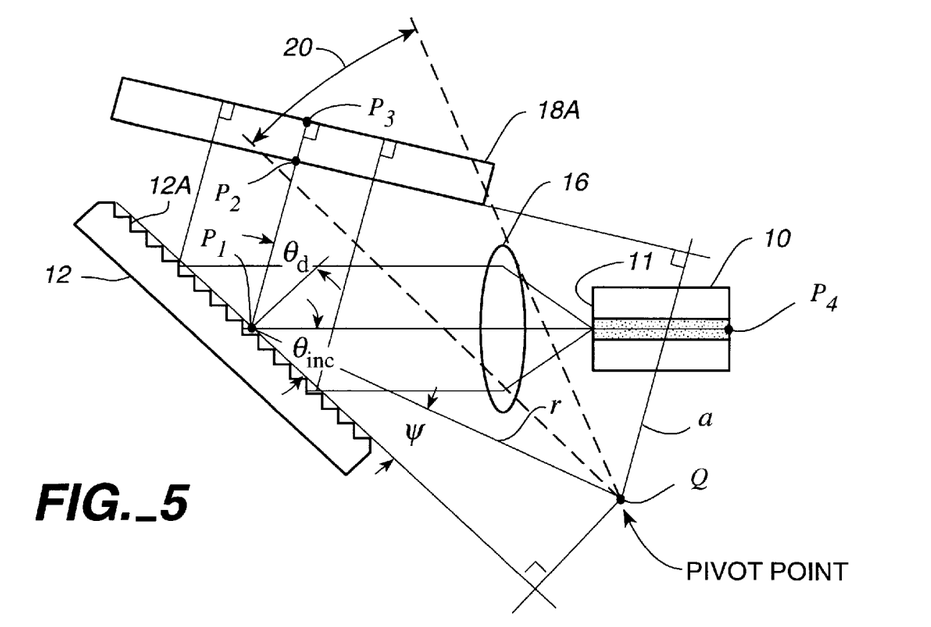
FIG. 5 is a schematic illustration of a modified Littman type configuration comprising a first embodiment of this invention.
Figure 6:
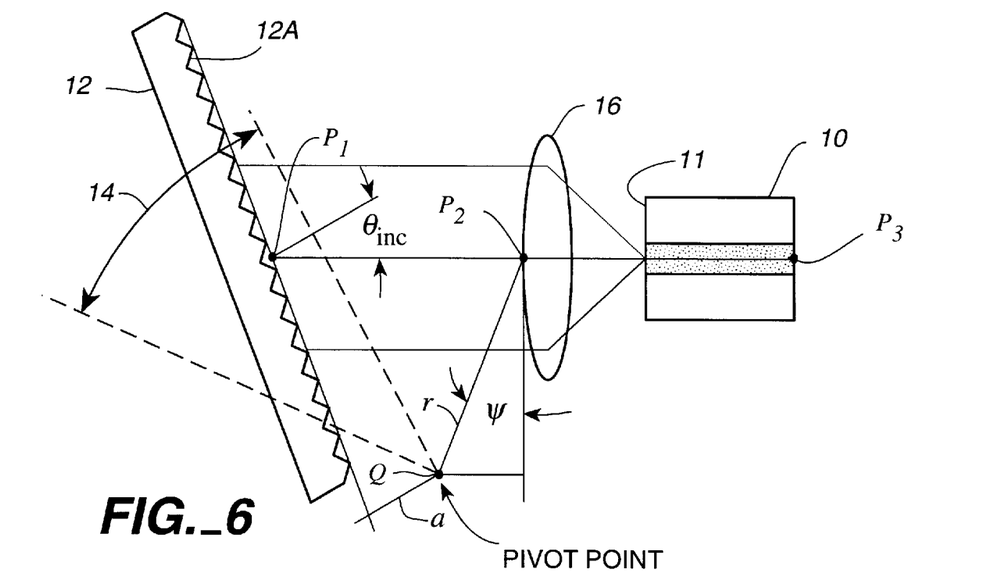
FIG. 6 is a schematic illustration of a modified Littrow type configuration comprising a second embodiment of this invention.

In the expression for $g(\lambda)$ there are three degrees of freedom available for design with simple rotation; the coordinates of the pivot point with respect to the fixed elements and the displacement of the movable elements from a rotating plane, e.g., the distances r and a and the angle $\psi$, as illustrated, for example, in FIGS. 5 and 6. These three variables may be selected so as to produce the optimum continuous tuning range for the optical cavity. The three degrees of freedom are referred to as the design variables of the cavity.

One possible approach for choosing the values of the design variables is to numerically solve the equations:

$$g(\lambda_1) = 0, g(\lambda_2) = 0, g(\lambda_3) = 0 \tag{4}$$

for three separate wavelengths $\lambda_1$, $\lambda_2$, and $\lambda_3$, as in the case of U.S. Pat. No. 5,319,668, which are typically the two wavelengths at each end of the tuning range and the center wavelength of the tuning range. This choice of pivot point gives a cavity phase error that goes to zero at three separate points but that deviates from zero at wavelengths in between, as illustrated in FIG. 3. For the Littman configuration of FIG. 1B, the condition expressed in equation (4) is equivalent to the condition obtained by the geometric construction disclosed U.S. Pat. No. 5,319,668, which employs a different basis and approach than that employed in the instant invention to obtain the pivot point for the rotatable optical element(s). An advantage of the present invention over U.S. Pat. No. 5,319,668 is that the method of the present invention may be employed to provide continuous single-mode tunability from other external cavity configurations which are not limited to the specific Littman configuration disclosed in U.S. Pat. No. 5,319,668.

Figure 4:
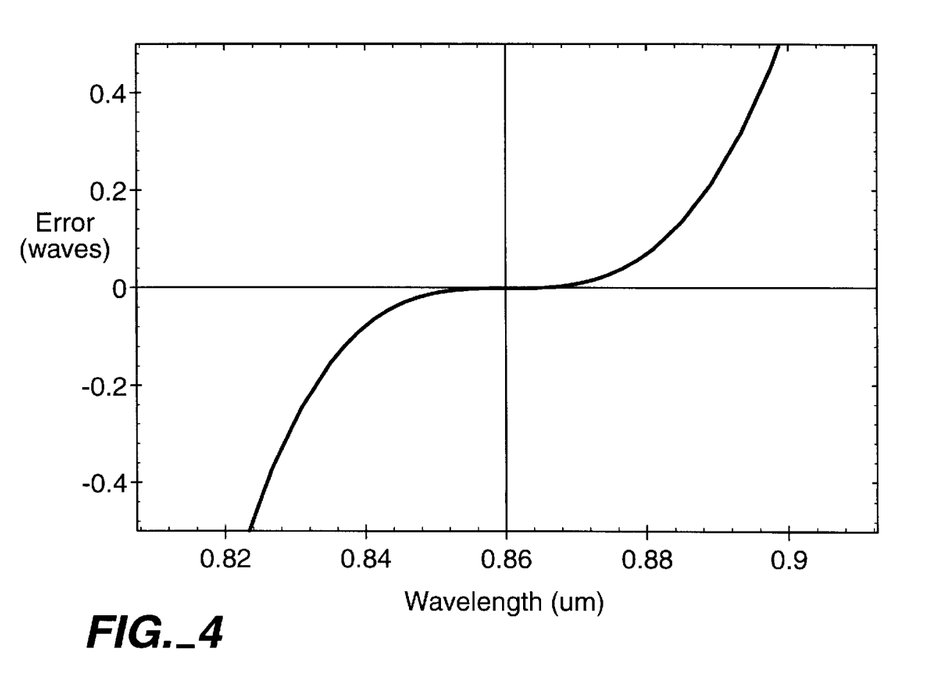
FIG. 4 is a graphical representation of the residual error in mirror position across the selectable wavelength band of an external cavity, continuously tunable wavelength source comprising a laser diode in accordance with the single position calculation approach of this invention.

Because deviations of the cavity phase from the ideal case can cause variations in power and/or linewidth, it is a desirable property to set the cavity phase to be maximally flat about the center wavelength of the tuning band of the cavity. Under this condition, the cavity phase error goes to zero at exactly one wavelength, as illustrated in FIG. 4, as distinguished from the previous condition in which the cavity phase error goes to zero at three different wavelengths, as illustrated in FIG. 3, with slight deviation from zero at wavelengths close to the center wavelength of the tuning band. The cavity phase error illustrated in FIGS. 3 and 4 is in conjunction with the Littman type configuration. As can be seen from FIG. 4, a flatter phase error near the wavelength center is achieved with the present invention, at the expense of a somewhat smaller continuous tuning range. The desirable configuration of achieving flat cavity phase error about the central wavelength of the tuning band is achieved by solving the three simultaneous equations:

$$g(\lambda) = 0, g'(\lambda) = 0, g''(\lambda) = 0 \tag{5}$$

at the center wavelength of the continuous tuning range for the three above mentioned design variables.

Several embodiments of external cavity, continuously tunable wavelength sources are now described in accordance with the single position calculation approach of this invention.

First Embodiment

Reference is now made to FIG. 5 to explain a first embodiment of this invention relative to the Littman configuration of FIG. 1B but in the case here, employing a reflective element in the form of a rotatable right-angle prism 18A. The maximally flat condition is satisfied at a predetermined design wavelength, $\lambda_0$. In this configuration, the fixed OPL part, $L_f(\lambda)$, is given by the sum of the OPL between points $P_2$ and $P_3$ and the OPL between points $P_1$ and $P_4$, i.e., $$L_f(\lambda)=l_p n_p(\lambda)+l_l n_l(\lambda)+l_a n_a(\lambda)+l_d n_d(\lambda) \quad (6)$$

where $l_p$ is the thickness of prism 18A and $n_p(\lambda)$ is the index of refraction of prism 18A; $l_l$ is the thickness of lens 16 and $n_l(\lambda)$ is the index of refraction of lens 16; $l_a$ is the air gap between lens 16 and laser diode 10 and $n_a(\lambda)$ is the index of refraction of air; and $l_d$ is the length of laser diode 10 and $n_d(\lambda)$ is the effective index of refraction of laser diode 10.

The variable OPL is determined by the rotation angle and diffraction angle of prism 18A. For a fixed angle of incidence, $\theta_{inc}$, the diffracted angle is given by $$\theta_d(\lambda) = \sin^{-1}\left[\sin\theta_{inc} - \frac{\lambda}{\Lambda}\right], \quad (7)$$

and, thus, the actual variable OPL is given by $$L_v^{(actual)}(\lambda)=n_a(\lambda)[a+r\sin(\psi-\theta_d(\lambda))], \quad (8)$$

while, as in equation (2), the ideal variable OPL is given by $$L_v^{(ideal)}(\lambda) = \left[\frac{\lambda}{\lambda_0}(L_f(\lambda_0) + L_v^{(ideal)}(\lambda_0)) - L_f(\lambda)\right] \quad (9)$$

The cavity phase error is, consequently, given by $$g(\lambda) \equiv \frac{L_v^{(ideal)}(\lambda) - L_v^{(actual)}(\lambda)}{\lambda}. \quad (10)$$

and the variables a, r, and $\psi$ are determined by choosing a design wavelength $\lambda_0$ and a design distance $L_v^{(ideal)}(\lambda_0)$ and solving the three equations that determine the maximally flat condition, $$g(\lambda)=0, g'(\lambda)=0, g''(\lambda)=0 \quad (11)$$

which may be solved numerically by means generally known in the art or may be solved analytically as shown below.

An analytic solution to these three equations is given as follows. Define the following functions:

$$l_v^{(ideal)}(\lambda) \equiv \frac{1}{n_a(\lambda)} L_v^{(ideal)}(\lambda) = \quad (12)$$

-continued
$$\frac{1}{n_a(\lambda)}\left[\frac{\lambda}{\lambda_0}(L_f(\lambda_0) + L_v^{(ideal)}(\lambda_0)) - L_f(\lambda)\right]$$

is the ideal separation between points $P_1$ and $P_2$;

$$\theta_{d0}=\sin^{-1}[\sin\theta_{inc}-\lambda_0/\Lambda] \quad (13)$$

is the diffracted angle at the design wavelength $\lambda_0$, where $\theta_{inc}$ is the angle of incidence of the chief ray upon grating mirror 12, as shown in FIG. 6, and $\Lambda$ is the period of grating 12A.

Further define the quantities:

$$l_v^{(0)} \equiv l_v^{(ideal)}(\lambda)|_{\lambda=\lambda_0}, \quad (14a)$$

$$l_v^{(1)} \equiv \frac{d\, l_v^{(ideal)}(\lambda)}{d\lambda}\bigg|_{\lambda=\lambda_0}, \quad (14b)$$

$$l_v^{(2)} \equiv \frac{d^2\, l_v^{(ideal)}(\lambda)}{d\lambda^2}\bigg|_{\lambda=\lambda_0}, \quad (14c)$$

$$\sigma \equiv -\frac{\Lambda l_v^{(2)} \cos^2\theta_{d0}}{l_v^{(1)}}. \quad (14d)$$

Then the three dimensions that define the location of the pivot point are given by $$\psi = \sin^{-1}\left(\frac{\sigma\cos\theta_{d0}}{[1+\sigma^2 - 2\sigma\sin\theta_{d0}]^{1/2}}\right), \quad (15a)$$

$$r \equiv \frac{l_{1,ideal}^{(1)}\cos\theta_{d0}}{\cos(\psi - \theta_{d0})}, \quad (15b)$$

$$a = l_v^{(ideal)} - r\sin(\psi - \theta_{d0}). \quad (15c)$$

The ideal location of the pivot point for grating mirror 12 is located a distance r from a point of intersection of the chief ray with the grating in the direction of the laser diode, rotated an angle $\psi$ upwards (downward if $\psi$ is negative) from the plane of the grating about the point of intersection.

It can be seen from the above that another embodiment of the invention may be realized by replacing prism 18A with a mirror, in which case the quantity, $l_p$, is simply set equal to zero in the above derivation.

Second Embodiment

In this embodiment, shown in FIG. 6, the fixed OPL $L_f(\lambda)$ is given by the OPL between points $P_2$ and $P_3$, i.e., $$L_f(\lambda)=l_l n_l(\lambda)+l_a n_a(\lambda)+l_d n_d(\lambda) \quad (16)$$

where $l_l$ is the thickness of lens 16 and $n_l(\lambda)$ is the index of refraction of lens 16; $l_a$ is the air gap between lens 16 and laser diode 10 and $n_a(\lambda)$ is the index of refraction of air; and $l_d$ is the length of laser diode 10 and $n_d(\lambda)$ is the effective index of refraction of laser diode 10.

In this Littrow configuration, the angle of incidence, $\theta_{inc}$, is wavelength dependent and is given by $$\theta_{inc}(\lambda) = \sin^{-1}\left[\frac{\lambda}{2\Lambda}\right], \quad (17)$$

where $\Lambda$ is the period of grating 12A.

The variable OPL part, $L_v(\lambda)$, is the distance between points $P_1$ and $P_2$ and is given by $$L_v^{(actual)}(\lambda) = n_a(\lambda)\frac{r\sin(\psi + \theta_{inc}(\lambda)) + a}{\cos\theta_{inc}(\lambda)}. \tag{18}$$

Solutions for a, r, and ψ in FIG. 6 that provide large continuous tuning ranges may be found, as above, by deriving the cavity phase error function from equation (3) and solving the three maximally flat equations (5) or by setting the cavity phase error function equal to zero at three distinct wavelengths as in equation (4). This solution is an improvement over any previous Littrow configuration which did not deal with the effects of dispersion in the optical elements or of the laser diode.

Third Embodiment

Figure 7:
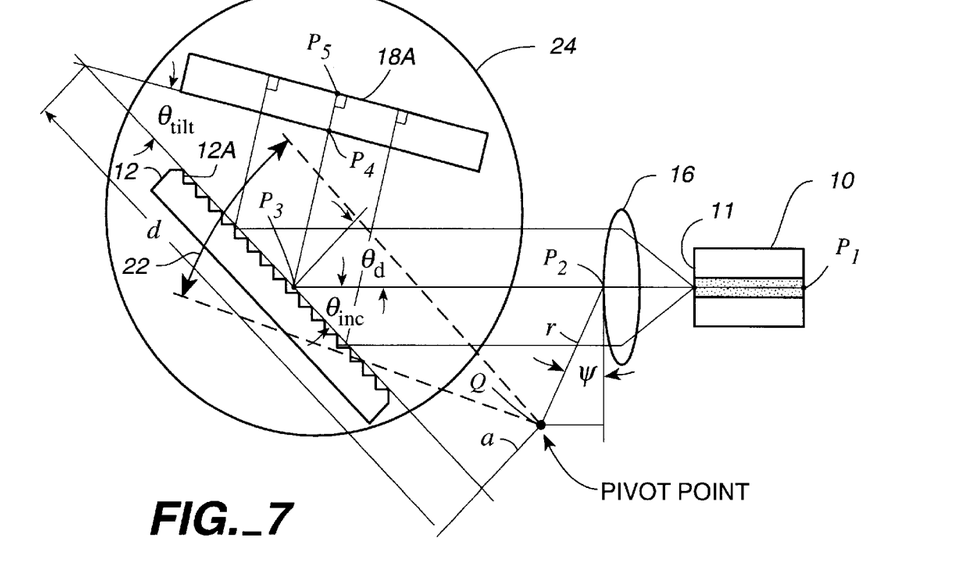
FIG. 7 is a schematic illustration of a modified Littman type configuration comprising a third embodiment of this invention.

A third embodiment of the invention is made with respect to a hybrid Littrow/Littman cavity shown in FIG. 7, in which a grating 12 and a reflecting prism element 18A, e.g., a right-angle prism, are affixed with respect to each other and are rotated together as one element. However, there are other configurations where grating 12 and a prism element 18A are not affixed to each other, i.e., prism element 18A is rotated while grating 12 remains in fixed position. Both of these configurations are disclosed in U.S. patent, which is based upon patent application Ser. No. 08/497,435, filed Jun. 30, 1995 and entitled, "Light Emitting Optical Device With External Retro-Reflector", incorporated herein by reference.

In this embodiment, the fixed OPL part, $L_f(\lambda)$, is given by the sum of the OPL between points $P_1$ and $P_2$, and the OPL between points $P_4$ and $P_5$, i.e., $$L_f(\lambda) = l_p n_p(\lambda) + l_l n_l(\lambda) + l_a n_a(\lambda) + l_d n_d(\lambda) \tag{19}$$

where $l_p$ is the thickness of prism 18A and $n_p(\lambda)$ is the index of refraction of prism element 18A; $l_l$ is the thickness of lens 16 and $n_l(\lambda)$ is the index of refraction of lens 16; $l_a$ is the air gap between lens 16 and laser diode 10 and $n_a(\lambda)$ is the index of refraction of air; and $l_d$ is the length of laser diode 10 and $n_d(\lambda)$ is the effective index of refraction of laser diode 10.

The variable OPL part, $L_v(\lambda)$, is given by the sum of the OPL between points $P_2$ and $P_3$ and the OPL between points $P_3$ and $P_4$, which is different from both the Littman and Littrow configurations.

As in the Littrow geometry, the angle of incidence ein, is wavelength-dependent. The variable OPL is given by $$L_v^{(actual)}(\lambda) = n_a(\lambda)\left[\frac{r\sin(\psi + \theta_{inc}(\lambda)) + a}{\cos\theta_{inc}(\lambda)} + \sin\theta_{tilt}\left(d - \frac{(a + r\cos\psi)}{\cos\theta_{inc}(\lambda)}\right)\right]. \tag{21}$$

Solutions for a, r, and ψ in FIG. 7 that provide large continuous tuning ranges may be found as before by constructing the cavity phase error function from equation (3) and solving the maximally flat equations in equation (5) or by setting the cavity phase error function equal to zero at three distinct wavelengths as in equation (4). This solution will provide for improved performance in single-mode continuous tuning results for the external cavity design disclosed in Ser. No. 08/497,435, filed Jun. 30, 1995, supra.

Fourth Embodiment

Figure 8:
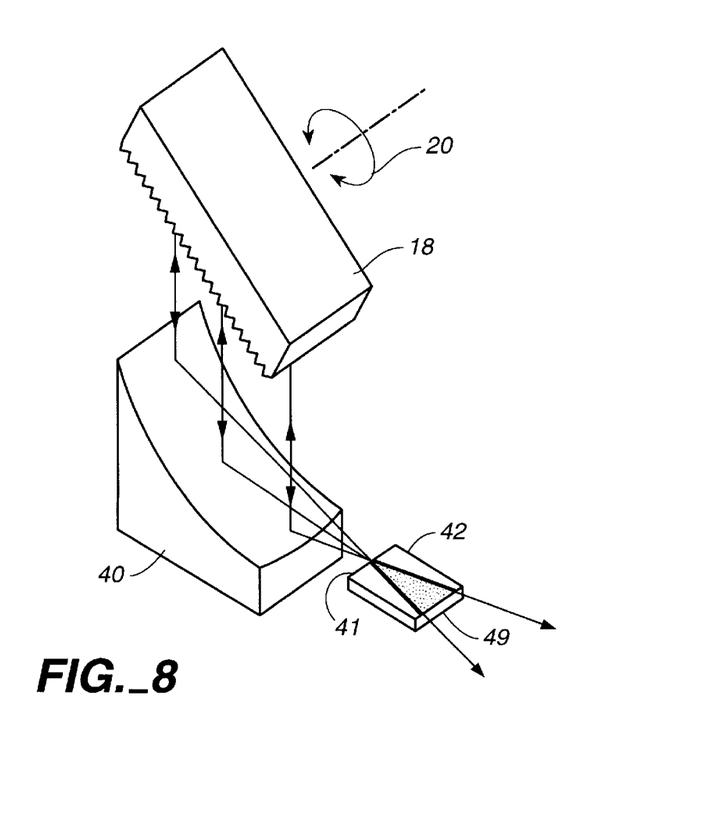
FIG. 8 is a schematic illustration of a modified Littrow type configuration comprising a fourth embodiment of this invention.
Figure 9:
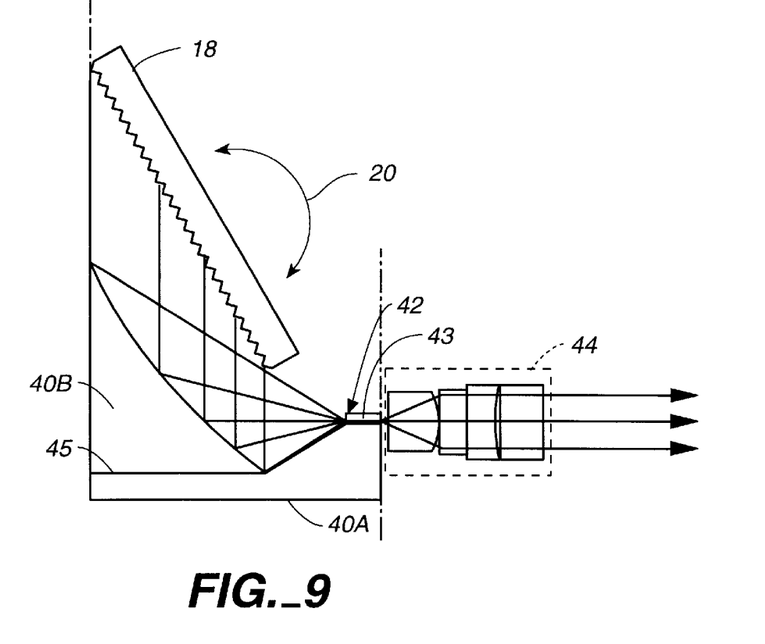
FIG. 9 is a side elevation of the configuration shown in FIG. 8.

Reference is now made to FIGS. 8 and 9 illustrating a fourth embodiment of this invention. The external cavity, continuously tunable source of this embodiment includes a gain element 42. Gain element 42 may be a flared amplifier or a single mode waveguide. These gain elements will explained in further detail later Element 42 is optically coupled to an external cavity for achieving single longitudinal mode operation comprising a 90° off-axis paraboloidal reflector 40 functioning as a collimating element. The reflection from paraboloidal reflector 40 is optically coupled to a retroreflecting diffraction grating 18 oriented in the Littrow configuration with wavelength tuning accomplished by means of rotation of grating 18 in the manner indicated by arrow 20. Paraboloidal reflector 40 functions as a collimator, and provides for very short cavity length compared to the beam diameter yielding single mode operation even in cases of using low incidence angle with grating 18 for compact low profile designs. AR coated rear facet 41 of gain element 42 is aligned so as to have its output focused to the focal point of paraboloid reflector 40. Paraboloidal reflector 40 collimates the light beam and directs the beam onto grating 18 to substantially retroreflect the beam. The retroreflected beam is refocused by paraboloidal reflector 40 and reflected back into gain element 42 via AR facet 41.

As shown in FIG. 9, paraboloidal reflector 40 may be formed of two principal components: heat sink support 40A for gain element 42 mounted on support surface 43 and with back surface 45 supporting paraboloidal reflector element 40B. Lens system 44 provides for collimating the beam. The emitted beam from gain element 42 may possess significant astigmatism at its output facet 49 as is well known in the case of flared type amplifiers. This astigmatism is removed by lens system 44 as taught in U.S. Pat. No. 5,321,718, which is incorporated herein by reference thereto.

In order to achieve single-line tunable laser operation via an external cavity, it is necessary to insure that the external cavity possesses sufficient gain discrimination to pick out a single mode of the extended cavity. However, while the spacing of the external cavity modes is easily determined from the optical cavity length, the analysis of the wavelength selectivity is more complicated principally because wavelength selectivity is affected not only by the grating period of the diffraction grating 18 and its angle of incidence, but also by the diameter of the light beam incident on grating 18 and the angle of the diffraction grating. Due to such complexities, the simple Littrow configuration has often been thought to possess insufficient gain selectivity to provide for single longitudinal mode operation without the employment of additional tuning elements, such as reported by T. Day et al. in the article, "Continuously Tunable Diode Lasers", Lasers and Optronics, pp. 15–17, June, 1993. Therefore, it is thought a necessary requirement to utilize the more complex Littman configurations to achieve single-line operation which is not correct.

If the optical path length of the external cavity is made shorter compared to the light beam diameter incident upon grating 18, it is possible to achieve single longitudinal mode operation with the Littrow configuration utilized in this embodiment similar to that achievable with more complex Littman cavity configurations. By employing paraboloidal collimator/reflector having an off-axis reflector, the optical path length between gain element 42 and grating 18 can be successfully made compact and minimized through positioning of grating 18 as close as possible to paraboloidal collimator/reflector without vignetting, and also provide for lengthening the optical cavity by double reflection, to achieve a gain selectivity level comparable to that achievable with Littman configurations. The configuration for this modified embodiment is shown in FIG. 9A.

Figure 9A:
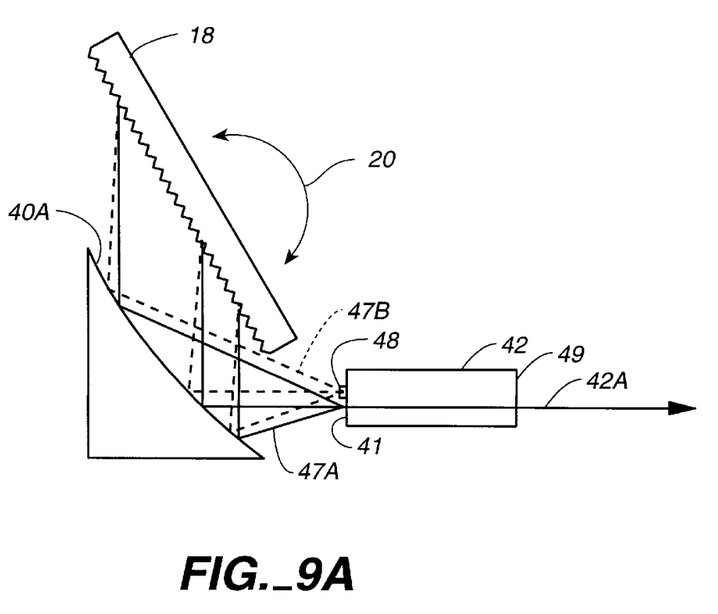
FIG. 9A is a side elevation of a modified form of the fourth embodiment of this invention in FIG. 8.

In FIG. 9A, paraboloidal reflector 40A has an off-axis parabolic surface which collimates light beam 47A received from optical cavity 42A of gain element 42 via AR facet 41 and redirects beam 47A onto diffraction grating 18 to substantially retroreflect the beam. The retroreflected beam 47B is refocused by paraboloidal reflector 40A to strike a reflective stripe 48 formed on AR facet 41. Stripe 48 may be rectangular shaped stripe extending in the direction of the plane of active region 42A of gain element 42. Reflective stripe 48 may be 95% reflective and is lithograhically deposited on AR facet 41 employing conventional CVD techniques. The light beam 47B is then reflected back to grating 18 along the same path and is reflected for second time from grating 18 for refocusing by paraboloidal reflector 40 back into optical cavity 42A of gain element 42. Thus, it can be seen that the use of an off-axis reflective collimator permits comparatively short cavity lengths compared to beam diameter yielding single mode operation with low angles of incidence with the diffraction grating.

The external optical cavity employing this double reflective cavity portion 47A, 7B simplifies cavity alignment. For example, if paraboloidal reflector 40A is slightly misaligned in the direction parallel to the longitudinal extent of stripe 48 (or relative to the direction of the plane of active region 42A), the laterally displaced image on stripe 48 will still be reflected from stripe 48 back onto paraboloidal reflector 40A. In the case of misalignment of the image in a direction perpendicular to the direction of the plane of active region 42A, the narrowness of the width of stripe 48 coupled with the dispersion provided by the effect of grating 18 insure that single-line operation will still be achieved. However, if paraboloidal reflector 40A is vertically misaligned relative to stripe 48, then the external cavity will be effective to establish lasing conditions but the tuned wavelength may be slightly different. Therefore, the tolerance as to vertical alignment of paraboloidal reflector 40A relative to the optical axis of optical cavity 47 is limited only by the diffraction-limited field of view provided by paraboloidal reflector 40A. Paraboloidal reflector 40A provides diffraction-limited performance even for displacements as large as ±100 μm.

The angle of incidence in this embodiment is only approximately 60°, compared to the case of Littman cavities which are approximately 85°, so that the diffraction efficiency of grating 18 is much higher resulting in high reflectivity level and corresponding feedback to gain element 42.

Figure 10:
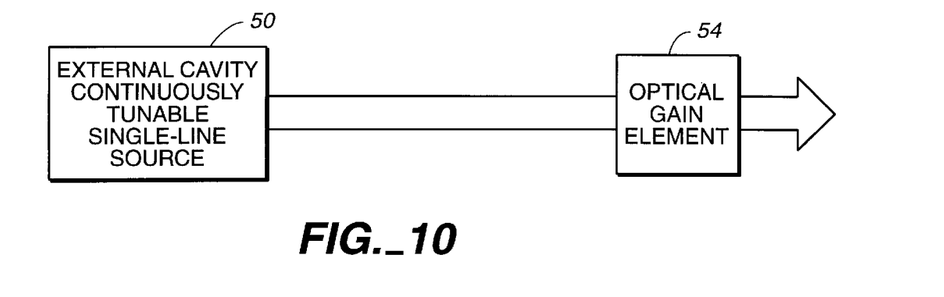
FIG. 10 is a high level, generic schematic representation of the basic elements of a master oscillator power amplifier (MOPA) relative to the application of the several embodiments of this invention relative to both the applicable single mode tunable laser source and the applicable optically coupled gain element.

Any one of the four previously described embodiments relate to four different continuously tunable cavities, which are collectively referred to "external cavity continuously tunable wavelength sources" and identified, as such, in FIG. 10 as external cavity, single-line or wavelength source 50 optically coupled to an optical gain element 54, which element is selected according to a particular single-line or wavelength application to be accomplished. It will be appreciated that the method described in the invention and illustrated in connection with any one of the four embodiments may be applied to other single mode tunable laser source containing other arrangements of gratings, prisms, mirrors, and other optical elements, as well as to single mode tunable laser sources with gain media other than specific to semiconductor laser diodes as illustrated here, e.g., solid-state lasers, doped optical fibers, and rare-earth-doped planar waveguides, and gain media that are pumped other than electronically, i.e., optically pumped gain media.

Figure 11:
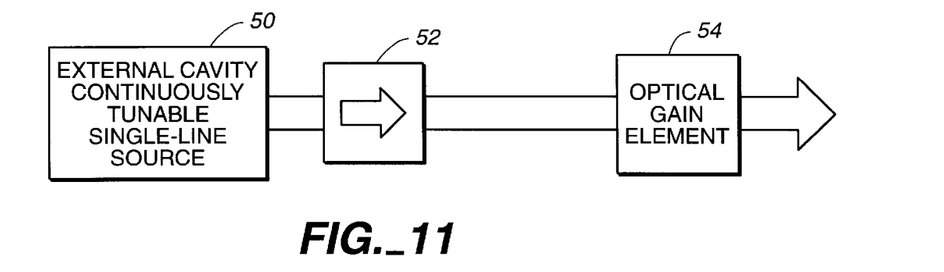
FIG. 11 is another is a high level, generic schematic representation of the basic elements relative to the application of the several embodiments of this invention in conjunction with an optical isolator.

Having discussed in detail various embodiments of external cavity, continuously tunable wavelength sources, attention is now directed to various applications of such sources as applied to various embodiments of different kinds of optical gain elements. FIG. 10 represents a high level form of the invention comprising external cavity, continuously tunable single-line source 50 providing a single wavelength output to optical gain element 54. In particular, if AR coatings or nonreflective surfaces are appropriately prepared or applied to the output facet of external cavity, continuously tunable single-line source 50 and to the input of optical gain element 54, no intervening device to prevent reflective feedback is necessary between devices 50 and 54. Alternatively, such a preventive feedback device may be utilized, such as shown in FIG. 11 comprising an isolator, e.g., a Faraday rotation isolator, to suppress compound cavity effects between source 50 and gain element 54 preserving the single mode, narrow bandwidth spectrum of source 50.

Figure 12:
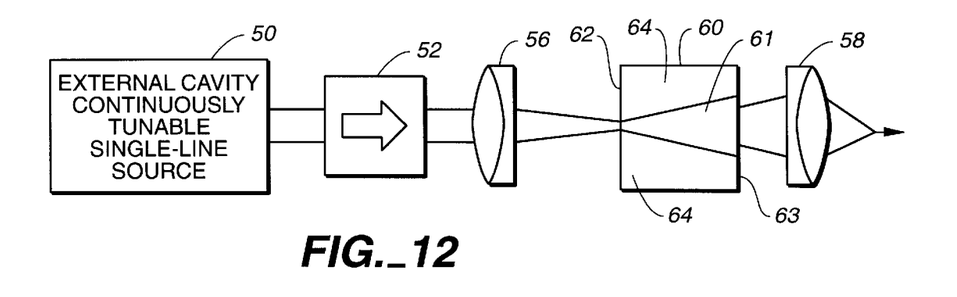
FIG. 12 is a schematic representation of FIG. 10 with a flared amplifier as the optical gain element comprising a fifth embodiment of this invention.

FIGS. 12–19 represent different variations of optical gain elements 54 that may be utilized in conjunction with the single mode, single linewidth source 50 of this invention. These particular applications are only a limited number of many possible representative examples that may be utilized in conjunction with source 50. In FIG. 12, optical gain element 54 comprises a flared or tapered gain device 60 having a monotonically increasing gain region 61 from input facet 62 to its output facet 63 expanding the propagating light beam via diffraction within region 61 to fill the output aperture at facet 63. Such a gain element is shown in FIG. 6 of U.S. Pat. No. 5,392,308, which patent is incorporated herein by reference thereto. Facet 62 is antirefection (AR) coated and is optically coupled to single line source 50 via aspheric collimator lens 56. Region 61 can be generically characterized as a gain region having a narrow input end and wider output end so as to have a lateral dimension along the longitudinal length of its optical internal cavity greater than a lateral dimension along any other portions of the optical internal cavity. Output facet 63 has a low reflectivity (LR) coating for providing a amplified output, via objective lens 58, of the incident single mode beam received from source 50. As the light beam propagating within region 61 expands, it is uniformly amplified via a current pump source so that the field intensity remains roughly constant as the width of gain region 61 montonically increases. Thus, a few milliwatts of power at the single mode aperture of input facet 62 is amplified to about 1 W or more at facet 63 providing a high power output beam while retaining diffraction limited beam quality.

The LR coating at facet 63 will provide some feedback into gain region 61 but will continually diverge during its backward propagation expanding beyond the limits of region 61 and will, therefore, be absorbed in absorbing regions 64, while a small portion of the backward propagating light will pass through the single mode aperture at facet 62 and will be consequently blocked by isolator 52. The output of element 60 has astigmatism since the virtual source of the output beam lies, in part, behind facet 63 so that an astigmatic corrective lens system may be employed at the output of element 60 at 58 as previously referenced.

The tunable structure of FIG. 12 is basically a master oscillator power amplifier (MOPA) in that source 50 functions as a master oscillator for providing tuned wavelength for amplifier element 60. Source 50 can include a low threshold, high thermal stability, broadband tunable single stripe laser diode, tunable over a range greater than 100 nm. Because of the design of source 50 as applied, its output beam remains diffraction limited despite threshold current increases of two to three times required at the end regions of its tuning range. Also, amplifier element 60 with an AR coating on its facet 62 functioning as a single-pass amplifying device minimizing feedback to master oscillator source 50 so that the need for isolator 52 can be eliminated while maintaining diffraction limited beam quality of power outputs of 5 W cw and higher. Moreover, by having amplifier element 60 separated from master oscillator source 50, the high thermal load developed at element 60 is isolated from source 50 so that the spectral integrity of source 50 can be maintained as well as the frequency drift of source 50 can be minimized.

Figure 13:
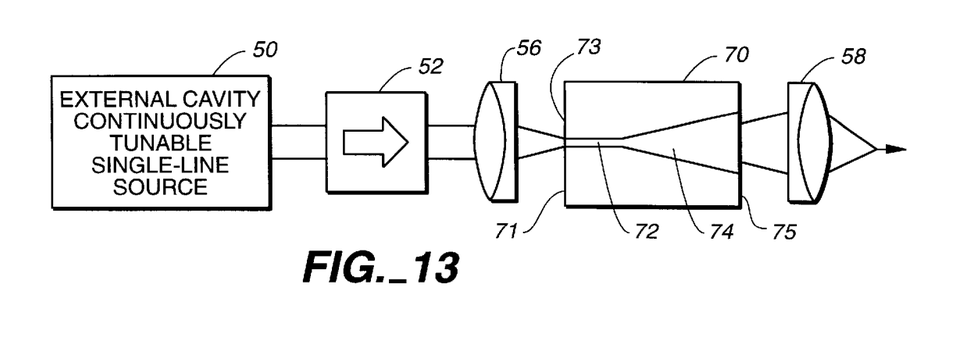
FIG. 13 is a schematic representation of FIG. 10 with a modified flared amplifier as the optical gain element comprising a sixth embodiment of this invention.

Reference is now made to FIG. 13 which discloses a MOPA wherein optical gain element 54 comprises a flared amplifier 70 having a single mode gain section 72 at input facet 71 for maintaining single mode operation and a gain region 74 monotonically increasing in dimension from its input at facet 73 to output facet 75 expanding the propagating light beam via diffraction within region 74 to fill the output aperture at facet 73. Region 74 can be generically characterized as a gain region having a narrow input end and wider output end so as to have a lateral dimension along the longitudinal length of its optical internal cavity greater than a lateral dimension along any other portions of the optical internal cavity. The advantage of the employment of a discrete flared amplifier element 70 with a single mode section is that single mode section 72 provides improved spatial mode selectivity.

Figure 14:
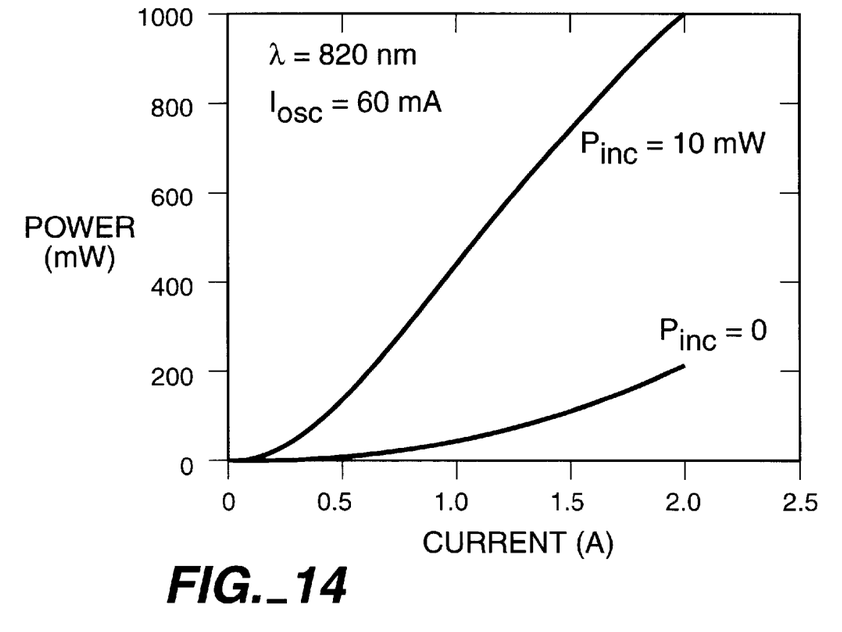
FIG. 14 is a graphic representation of the power performance of the MOPA in FIG. 13 for two different oscillator powers.
Figure 15:
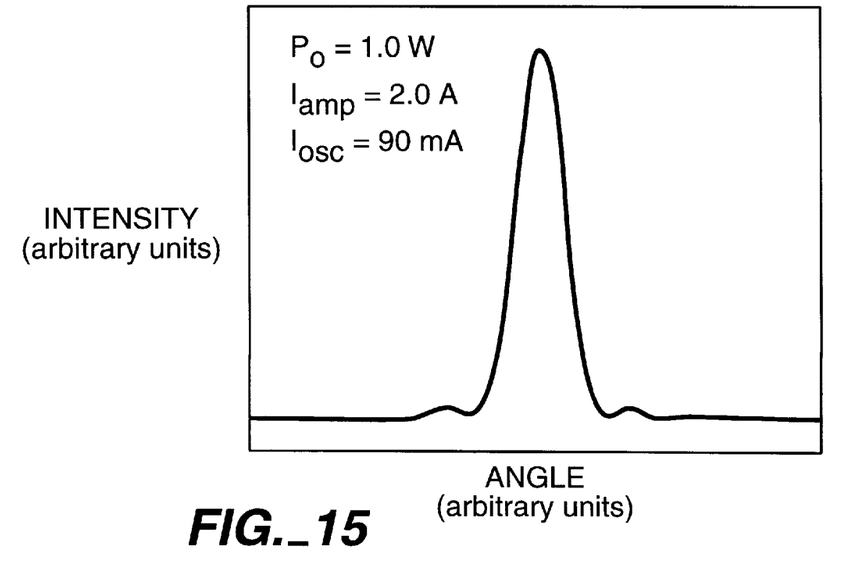
FIG. 15 is a graphic illustration of the far field output of the MOPA in FIG. 13.

FIG. 14 shows the typical output power for amplifier 70 for two different power levels provided via gain section 74. It can be seen that for an incident input power, $P_{inc}$ of about 10 mW, the cw output power is at about 1 W. FIG. 15 shows the far field pattern for this power level which is highly uniform.

Figure 16:
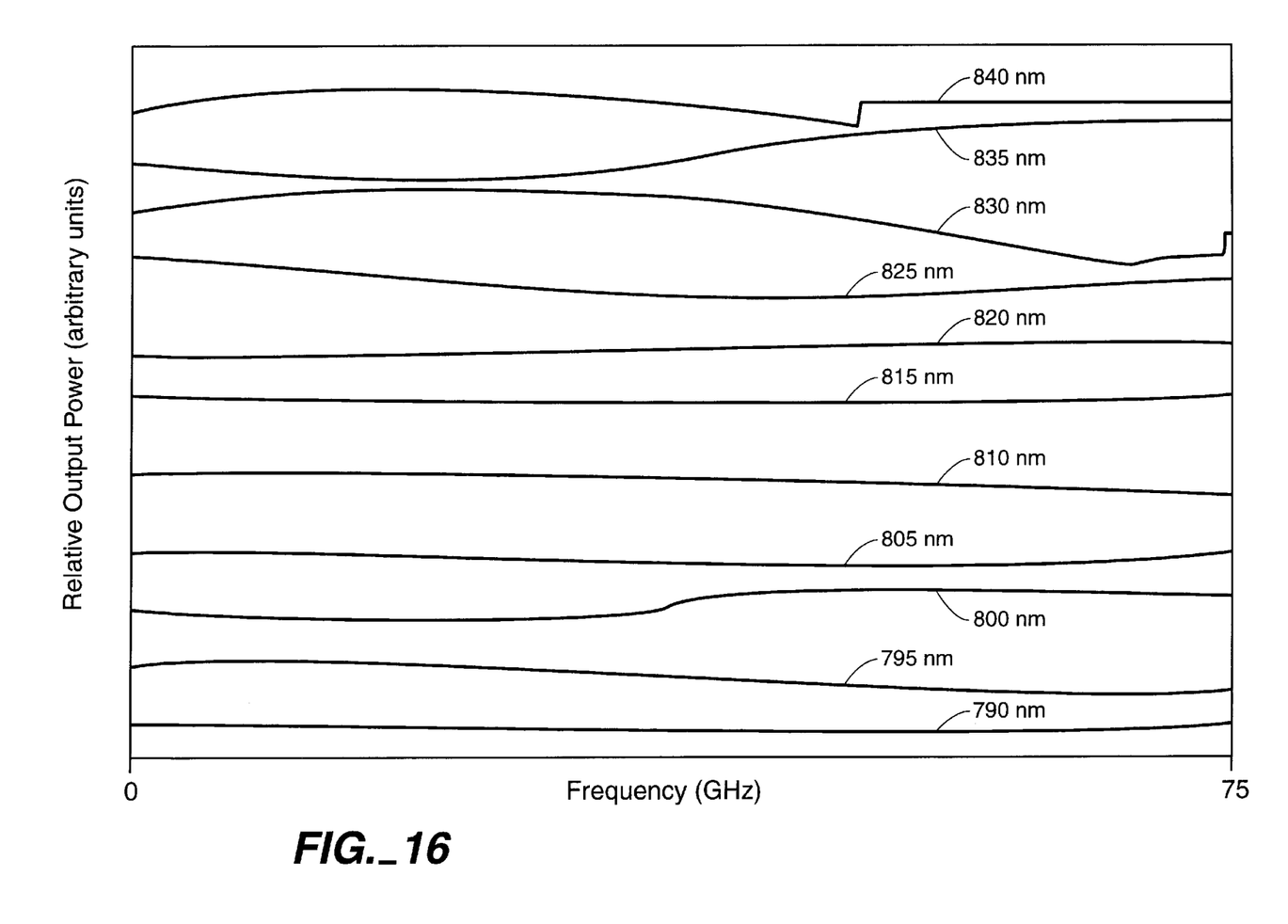
FIG. 16 is a graphic illustration of a family of tuned wavelength responses over a 75 GHz frequency bandwidth for the MOPA in FIG. 12.

FIG. 16 shows a family of curves for a single-line source 50 of the type shown in FIG. 5 as employed in conjunction with a MOPA. The output power of source 50 is continuously tunable, displaying single longitudinal mode, over a wide frequency range from 0 Hz to 75 Ghz and above at wavelengths between 790 nm and 840 nm. In almost every wavelength case, it can be seen that continuous tuning without longitudinal mode hops is achieved over a large wavelength range with output powers at gain element 70 up to 1 W cw.

Figure 17:
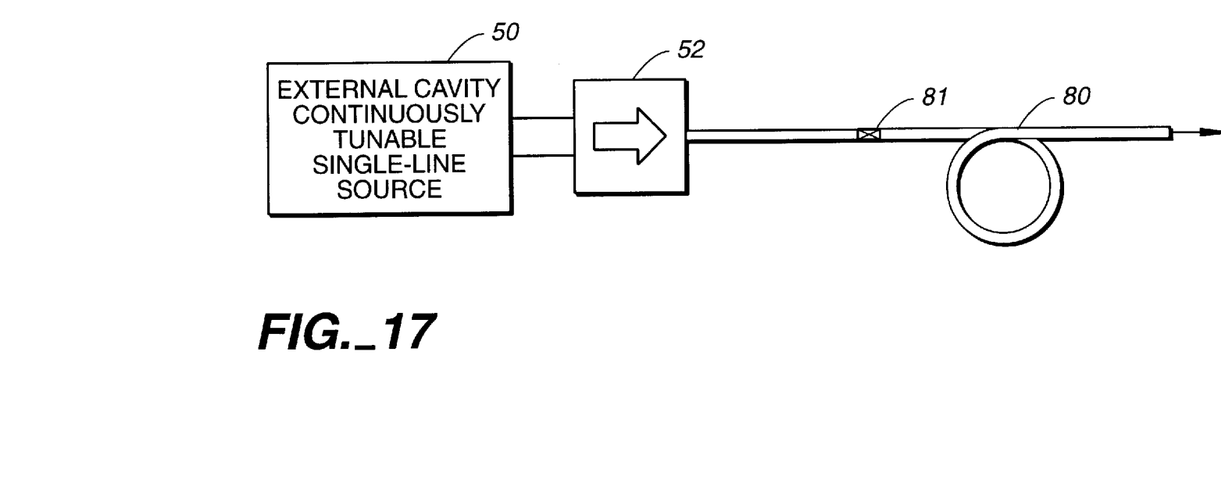
FIG. 17 is a schematic representation of FIG. 10 with a single core, doped fiber amplifier as the optical gain element comprising an eighth embodiment of this invention.
Figure 18:
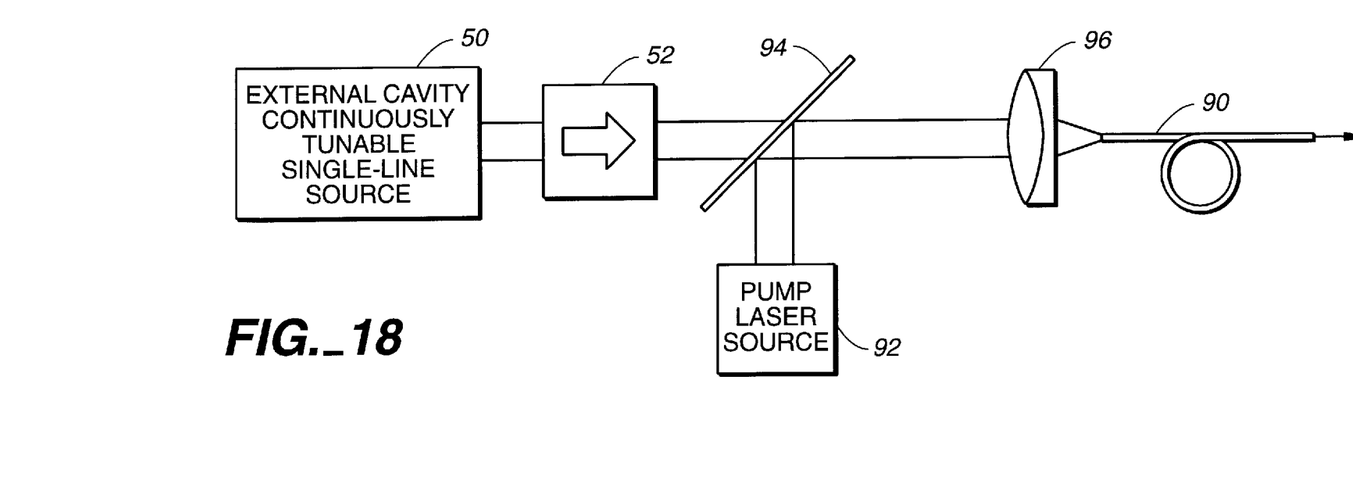
FIG. 18 is a schematic representation of FIG. 10 with a double clad, doped fiber amplifier as the optical gain element comprising a ninth embodiment of this invention.

Reference is now made to FIGS. 17 and 18 disclosing another application for this invention wherein single-line source 50 is coupled via isolator 52 to rare earth, core doped, optical fiber amplifier 80, as shown in FIG. 17. Amplifier 80 may be doped with Nd or Er or Yb or other rare-earths, or co-doped with a combination of rare-earths. In FIG. 18, single mode tunable laser source 50 is coupled via isolator 52 to double clad fiber amplifier 90 having an inner cladding doped with a rare earth dopant such as Nd or Er or Yb. The inner cladding of fiber amplifier 90 is pumped by high power laser diode or fiber coupled laser source 92. In this case, if source 50 has a tunable wavelength range of 1.5 $\mu$m to 1.6 $\mu$m, power outputs from amplifier 90 would exceed 1 W of wavelength tunable light power over a broad wavelength range of about 1.52 $\mu$ to 1.57 $\mu$m in a single transverse mode. The output of fiber amplifier 90 would, therefore, have application for fiber communications in CATV or telecom systems and in long distance optical fiber transmission where the operation of source 50 is pulsed or mode-locked to provide multi-GHz, high intensity, high energy pulse transmission.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications that are within the spirit and scope of the following claims.

What is claimed is:

1. A high power light source system comprising:
    a first optical cavity comprising
        a first semiconductor gain element having an internal optical cavity portion for producing a radiation beam,
        a wavelength tuning reflector element in an external optical cavity portion coupled to receive the radiation beam from said first semiconductor gain element and for reflecting a portion of said radiation beam back into said internal optical cavity for tuning said gain element to emit radiation at a selected wavelength within a tunable bandwidth and provide an output beam of the selected wavelength radiation,
        said optical cavity portions defining said first optical cavity; and
    a second optical cavity comprising
        a second semiconductor gain element separate from said first optical cavity for receiving said output from said first optical cavity for enhancing the gain of said output beam, said second semiconductor gain element having a flared gain section of monotonically increasing lateral dimension from its input to its output.

2. The high power light source system according to claim 1 further comprising an optical isolator between said first and second optical cavities.

3. The high power light source system according to claim 1 wherein wavelength selection via said wavelength tuning reflector element is accomplished by simultaneous rotational and translational movement of said reflecting means about a pivot point.

4. The high power light source system according to claim 1 wherein said external optical cavity portion comprises either a Littman cavity or a Littrow cavity.

5. The high power light source system according to claim 1 wherein an optical length of said external optical cavity portion is equal to a particular integral number of half wavelengths at one or more desired wavelengths within a tunable bandwidth such that cavity phase error is zero only at one selected wavelength which is at a central wavelength of said tunable bandwidth.

6. The high power light source system according to claim 5 wherein said external optical cavity portion comprises either a Littman cavity or a Littrow cavity.

7. The high power light source system according to claim 1 further comprising a single mode section in optical communication with said flared gain element to provide for spatial mode selectivity to said output beam.

8. The high power light source system according to claim 7 further comprising an optical isolator between said first and second optical cavities.

9. The high power light source system according to claim 7 wherein wavelength selection via said wavelength tuning reflector element is accomplished by simultaneous rotational and translational movement of said reflecting means about a pivot point.

10. The high power light source system according to claim 7 wherein said external optical cavity portion comprises either a Littman cavity or a Littrow cavity.

11. The high power light source system according to claim 7 wherein an optical length of said external optical cavity portion is equal to a particular integral number of half wavelengths at one or more desired wavelengths within a tunable bandwidth such that cavity phase error is zero only at one selected wavelength which is at a central wavelength of said tunable bandwidth.

12. The high power light source system according to claim 7 wherein said external optical cavity portion comprises either a Littman cavity or a Littrow cavity.

* * * * *